United States Patent
Liu

(10) Patent No.: US 9,276,225 B2
(45) Date of Patent: Mar. 1, 2016

(54) ELECTROLUMINESCENT DIODE DEVICE

(71) Applicant: SHENZHEN CHINA STAR OPTOELECTRONICS TECHNOLOGY CO., LTD., Shenzhen, Guangdong (CN)

(72) Inventor: Yawei Liu, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 14/241,395

(22) PCT Filed: Jan. 21, 2014

(86) PCT No.: PCT/CN2014/070996
§ 371 (c)(1),
(2) Date: Feb. 26, 2014

(87) PCT Pub. No.: WO2014/201869
PCT Pub. Date: Dec. 24, 2014

(65) Prior Publication Data
US 2015/0263299 A1    Sep. 17, 2015

(30) Foreign Application Priority Data
Jun. 21, 2013    (CN) .......................... 2013 1 0250662

(51) Int. Cl.
*H01L 29/08* (2006.01)
*H01L 35/24* (2006.01)
(Continued)

(52) U.S. Cl.
CPC ............ *H01L 51/0097* (2013.01); *C09K 11/06* (2013.01); *H01L 51/0072* (2013.01); *H01L 51/5012* (2013.01); *H01L 51/5056* (2013.01);
(Continued)

(58) Field of Classification Search
USPC .................... 257/40; 438/34; 361/749, 748
See application file for complete search history.

(56) References Cited

U.S. PATENT DOCUMENTS 7,279,704 B2 * 10/2007 Walters ................. C09K 11/06
257/40
2009/0075098 A1   3/2009 Tsukahara et al. ............ 428/451
(Continued)

FOREIGN PATENT DOCUMENTS

| CN | 101080121 A | 11/2007 |
|---|---|---|
| CN | 102723444 A | 10/2012 |

(Continued)

OTHER PUBLICATIONS

International Search Report dated Apr. 22, 2014, issued to the corresponding International Application No. PCT/CN2014/070996.
(Continued)

*Primary Examiner* — Dao H Nguyen
*Assistant Examiner* — Tram H Nguyen
(74) *Attorney, Agent, or Firm* — Stein IP, LLC

(57) ABSTRACT

The present disclosure relates to an electroluminescent diode device, comprising a transparent flexible substrate which is successively disposed with a first protective layer, an anode, a hole transport layer, a UV light emitting layer, a hole blocking layer, an electron transport layer, and a cathode, wherein the UV light emitting layer comprises a UV light emitting material which is at least one selected from the group consisting of fluorenes, triphenylamines, and quinquephenyls.

16 Claims, 2 Drawing Sheets

(51) Int. Cl.
*H01L 51/00* (2006.01)
*C09K 11/06* (2006.01)
*H01L 51/50* (2006.01)
*H01L 51/52* (2006.01)

(52) U.S. Cl.
CPC ........ *H01L 51/5072* (2013.01); *H01L 51/5096* (2013.01); *H01L 51/5206* (2013.01); *H01L 51/5221* (2013.01); *H01L 51/5246* (2013.01); *H01L 51/5256* (2013.01); *C09K 2211/1011* (2013.01); *C09K 2211/1029* (2013.01); *H01L 51/004* (2013.01); *H01L 51/005* (2013.01); *H01L 51/0035* (2013.01); *H01L 2251/301* (2013.01); *H01L 2251/303* (2013.01); *H01L 2251/5338* (2013.01)

(56) References Cited

U.S. PATENT DOCUMENTS

| | | | | |
|---|---|---|---|---|
| 2010/0272933 A1* | 10/2010 | McCormick | ........... | C09J 7/0296 428/34.1 |
| 2011/0070672 A1* | 3/2011 | Lee | ........... | H01L 51/5253 438/26 |
| 2012/0068165 A1* | 3/2012 | Hayashi | ........... | C09K 11/06 257/40 |
| 2012/0286298 A1* | 11/2012 | Pang | ........... | H01L 51/5203 257/88 |
| 2013/0061928 A1* | 3/2013 | Yun | ........... | B82Y 10/00 136/263 |

FOREIGN PATENT DOCUMENTS

| | | |
|---|---|---|
| CN | 102760837 A | 10/2012 |
| CN | 102832351 A | 12/2012 |
| CN | 103325951 A | 9/2013 |
| WO | WO 2011/039506 A1 | 4/2011 |

OTHER PUBLICATIONS

"OLED", Nov. 2010, China Mediatech I2010 No. 5, Technology Forum, pp. 49-51.

* cited by examiner

ELECTROLUMINESCENT DIODE DEVICE

FIELD OF THE INVENTION

The present disclosure relates to a field of electroluminescent diode devices, specifically to an electroluminescent diode device, and more specifically to a flexible substrate based organic ultraviolet electroluminescent diode device and use thereof.

BACKGROUND OF THE INVENTION

UV light is an umbrella term for radiation whose wavelengths are in a range of 10~400 nm in the electromagnetic spectrum, and it is invisible to the naked human eye. A UV light source having fluorescent effects, biological effects, photochemical effects, and the photoelectric effect, is a non-lighting electric light source mainly aiming at generating ultraviolet radiation, and is suitable for the fields of industry, agriculture, national defense, medical treatment, etc. UV light sources have fluorescent effects, biological effects, photochemical effects, the photoelectric effects, etc. of UV radiation, and are widely used in the fields of industry, agriculture, national defense, medical treatment, etc.

The use of UV light in fluorescent effects is mainly for fluorescence analysis. After absorbing UV light, a substance will emit fluorescence reflecting its characteristics. Qualitative and quantitative analysis of the substance can be carried out according to its fluorescence characteristics. Specifically, UV light can be used: (1) for an analysis of inorganic elements and organic substances; (2) for an analysis of oil layers, ore, medicine, food, and carcinogenic substances; (3) as an adjunct to the public security department for analysis of blood, drugs, etc., as well as for identification of authenticity of banknotes, documents, etc. in case investigation; (4) for flaw detection; (5) as a biomarker; and (6) as a military biosensor.

The uses of UV light in biological effects are mainly on: (1) UV light sterilization: UV light having the wavelengths in a range of 200~275 nm has a sterilization effect which may be different according to different wavelengths thereof, wherein the sterilizing effect of the UV light having the wavelength in the range of 254~257 nm is the best. UV light irradiation has a wide antiseptic function and can kill all kinds of microbes. The sterilization mechanism thereof is to make the microbial nucleic acids, protoplasmic proteins, and enzymes die in chemical changes after absorbing UV energy; (2) body-care: living in the irradiation of UV rays contained in sunlight can boost man's immunity. Irradiation of UV light having wavelengths in the range of 280~400 nm can produce certain positive roles to human body organs, thus playing the role of keeping fit; (3) curing diseases: UV light may treat vulgaris plaque psoriasis skin diseases (such as psoriasis and vitiligo, etc.), internal diseases (such as chondropathy, infantile jaundice, etc.), surgical diseases (such as various cute inflammations), neurological diseases, and so on; study on treatment for late-stage malignant tumors by UV light autotransfusion, inactivate viruses, and so on; and (4) microbial mutation breeding and so on.

The use of UV light in photochemical effects: the energy gap that corresponds to UV light with wavelengths in the range of 200~400 nm is in the range of 6.2~3.1 eV, and the bond energy of chemical combination of many compounds is in the same range. Absorbing the energy may trigger lots of chemical reactions. Specific uses are as follows: (1) coating, pigment curing, photoengraving, printing down and duplication, photoetching and packaging of semiconductor devices, aging test of high polymer material, and the like; (2) organic photochemical reactions: under the UV light with the wavelengths in the range of 254~400 nm, electrons in organic matters may jump from the ground state to the excited state to produce organic photochemical reactions that may result in decomposition of organic matters; and (3) UV light oxidation treatment of TNT (trinitrotoluene) waste water, and UV light combined with natural light photo catalytic treatment of UDMH (unsymmetrical dimethylhydrazine) waste water.

UV light also has important uses in the fields of agriculture and animal husbandry: (1) UV light having wavelengths in the range of 300~400 nm is essential to plant growth; (2) insects are very sensitive to the UV light having wavelengths in the range of 300~400 nm. which therefore can be used for trapping and killing pests in the farmland; (3) sterilizing to henhouses and pens with UV light, and irradiation to livestock may increase the growth rate of livestock and the laying rate, and reduce the mortality rate of livestock.

In addition, UV/near-UV light is also widely used in the fields of pumped dyes emitting, white light illumination, high capacity data storage, etc.

Thus, the UV light source has a broad prospect in use in the industrial and agricultural production and in daily life. Since the advent of the world's first high-pressure mercury lamp in 1935, the UV light source has begun to attract people's widespread attention. Before the 1950s, mercury lamps were the only artificial UV light sources, but failed to be applied in practice. With the advent of quartz glass, the maturity of the encapsulation technology, the development of the electric vacuum industrial, and the perfection of ultraviolet spectroscopy, the ultraviolet light source moved towards the truly valuable use stage. In addition to the earliest mercury lamps, some new types of UV light sources emerged one after another in the late 1950s, which can be divided into mercury arc lamps, metal halide lamps, electrodeless lamps, xenon lamps, excimer UV lamps, and UV light-emitting diodes according to the varieties of lamps. Among these UV light sources, the most commonly used at present is the gaseous UV light source which has the following problems: high toxicity of the host materials, secondary pollutions, inconvenient use of the devices, vulnerability, and the like.

In contrast, the emerging of Ultraviolet-Organic Light Emitting Diode (UV-OLED), which is environmentally friendly, of low cost, easy large-area production, easy integration with flexible substrates, and the like, can make up for the current inadequacy of UV light sources. Especially, the flexible OLED display device, which is not only soft and can be deformed, but also is not easy to damage, can be mounted at curved surfaces and even disposed on clothing. Thus it is becoming a research hotspot in the international display industry increasingly. Currently, there is no discovery of relevant reports about a flexible substrate based organic ultraviolet electroluminescent diode device.

SUMMARY OF THE INVENTION

One object of the present disclosure is to provide an environmentally friendly, low-cost, all-solid-state, and flexible substrate based organic ultraviolet electroluminescent diode device, and to realize a UV light source on the flexible substrate, so as to make up for the deficiencies of current UV light sources and inconvenience in using the same.

Another object of the present disclosure is to provide use of the flexible substrate based organic ultraviolet electroluminescent diode device.

To achieve the above-mentioned objectives, the present disclosure provides an electroluminescent diode device, which comprises:

a transparent flexible substrate which is successively disposed with a first-protective layer, an anode, a hole transport layer, a UV light emitting layer, a hole blocking layer, an electron transport layer, and a cathode thereon, wherein the UV light emitting layer comprises a UV light-emitting material which is at least one selected from the group consisting of fluorenes, triphenylamines, and quinquephenyls.

In the light emitting diode (LED) of the present disclosure, the anode is used for injecting the hole into the device; the cathode is used for injecting electrons into the device; the hole transport layer comprises a hole transport material; the electron transport layer comprises an electron transport material; and the effect of luminescence can be achieved when the electron and the hole recombine in the emitting layer.

In one preferred embodiment of the present disclosure, the UV light emitting material comprises a structure as shown in Formula I which contains carbazole, or a structure as shown in Formula II which contains quinquephenyl.

Formula I

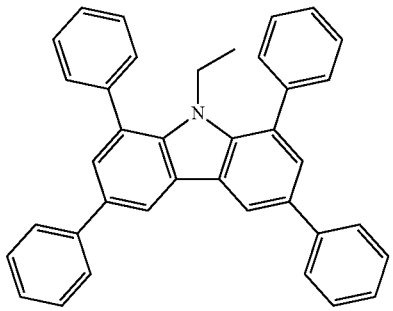

Formula II

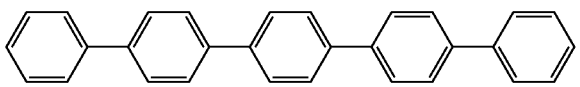

In one preferred embodiment of the present disclosure, the transparent flexible substrate comprises a light transmissive material with weak absorption to UV light. The light transmissive material is at least one selected from the group consisting of polymethylmethacrylate, poly(ethyleneglycol)adipate, and polycarbonate.

In one preferred embodiment of the present disclosure, the first protective layer consists of organic polymer materials, or alternating stacks of organic polymer material layers and inorganic material layers.

Since all the materials of the first protective layer shall allow the transmission of UV light, the organic polymer material layers may consist of at least one selected from the group consisting of polymethylmethacrylate, poly(ethyleneglycol) adipate, and polycarbonate; and the inorganic material layers may consist of materials having an optical band gap of no less than 3.96 eV, such as aluminium nitride, silicon nitride, silicon oxide, etc. Silicon nitride is the commonly used light transmissive medium of UV devices.

In one preferred embodiment of the present disclosure, the device further comprises a second protective layer which is disposed at an outer side of the cathode and covers an outer surface of the device except the transparent flexible substrate, for cooperating with the first protective layer so as to isolate the device from the outside air and water vapor.

The second protective layer is an inorganic protective layer.

The material of the inorganic protective layer is at least one selected from the group consisting of $TiO_2$, MgO, $SiO_2$, $ZrO_2$, ZnO, $Al_2O_3$, LiF, $MgF_2$, ZnS, $SiN_x$, $SiO_xN_y$, $SiO_xC_y$, and diamond like carbon (DLC) films.

In one preferred embodiment of the present disclosure, the electroluminescent diode device further comprises:

a packaging cover plate comprising a flexible cover plate, a third protective layer, and a desiccant layer arranged successively;

wherein the structure of the third protective layer may consist of organic polymer material layers, or alternating stacks of organic polymers material layers and inorganic material layers; and wherein the packaging cover plate and the electroluminescent diode are packaged in such a way that the desiccant layer of the packaging cover plate and an outer side of the second protective layer disposed to the electroluminescent diode are arranged opposite to each other with distance therebetween.

Specifically, the third protective layer may consist of the same flexible polymer material. The structure of the third protective layer is the same as that of the first protective layer, but the organic polymer material and the inorganic material therein are different from those of the first protective layer. In the third protective layer, the organic polymer material is at least one selected from the group consisting of poly-p-xylene, poly(monochloro-p-xylene), polyethylene, polystyrene, polypropylene, polyethylene naphthalate (PEN), polytetrafluoroethylene, soluble polytetrafluoroethylene, polyethylene terephthalate (PET), polycarbonate, polymethyl methacrylate, polyvinyl acetate, polyether sulfone resin, and polyimide; and the inorganic material are selected from the group consisting of $TiO_2$, MgO, $SiO_2$, $ZrO_2$, ZnO, $Al_2O_3$, LiF, $MgF_2$, ZnS, $SiN_x$, $SiO_xN_y$, $SiO_xC_y$, and DLC films.

The packaging is carried out by means of packaging adhesive, wherein the packaging adhesive is usually a UV light curing adhesive or a packaging adhesive formed by doping the UV light curing adhesive with glass powder. The objective of doping the UV light curing adhesive with glass powder is to prevent water vapor or oxygen from entering the inside of the package; meanwhile, glass powder allows the transmission of light and therefore will not stop the UV light irradiation curing of the packaging adhesive. In the direction vertical to water vapor permeation, the whole cross section of the packaging adhesive can be permeated by water vapor or oxygen before the UV light curing adhesive is doped with glass powder. After the UV light curing adhesive is doped with glass powder, owing to a certain area covered by the glass powder, the infiltration area of water vapor and oxygen may be reduced. Thus the infiltration capacity per unit time of water vapor or oxygen can be decreased, and better effect of packaging can be achieved. The diameter of glass powder should be in the range of 0.01~100 µm, and the doping proportion of UV light should be no more than 40% to complete the coating of adhesive materials.

In one preferred embodiment of the present disclosure, the size of the first protective layer is greater than other layers that are disposed above the first protective layer, and the size of the third protective layer is greater than other layers that are disposed above the third protective layer. In this way, the packaging between the packaging cover plate and electroluminescent diode is carried out by packaging the first protective layer and the third protective layer with the packaging adhesive to achieve the functional layers needed for the device luminescence, for example, the anode, the hole transport layer, the UV light emitting layer, the hole blocking layer, the electron transport layer, the cathode and the like, are packaged in the device to be isolated from the outside air and water vapor.

The present disclosure also provides a use of any one of the electroluminescent diode devices as described above in sterilization, fluorescence or photochemical reactions.

The beneficial effects of the present disclosure are as follows.

(1) Thanks to the all solid state of the light source, the problems present in the current commonly used gaseous UV light sources, such as high toxicity of host materials, the existence of second pollution, inconvenience in use of devices, vulnerability, and so on, can be overcome.

(2) As a vacuum device, the gaseous UV light source, whose size is difficult to make big, is usually a point light source or a line light source; the UV OLED which is an flat panel light source can be made into a large-area device.

(3) The starting voltage of a gaseous light source is 220V. However, the starting voltage of an ultraviolet OLED is only about 10V. While the starting voltage is reduced greatly, the power consumption of the device can be reduced significantly also, thus greatly improving the electro-optical conversion efficiency.

(4) A flexible UV OLED flat panel light source is deformable, foldable, and easy to carry and use.

DETAILED DESCRIPTION OF THE EMBODIMENTS

The present disclosure will be described in detail below with reference to the following drawings and examples, but it should be understood that the scope of the present disclosure is not limited to the following examples. Without departing from the scope and spirit of the present disclosure, various modifications and improvements can be made and the component therein can be replaced by an equivalent. Especially, various technical features mentioned in the examples can be combined in any way as long as there is no structural conflict.

Example 1

Figure 1:
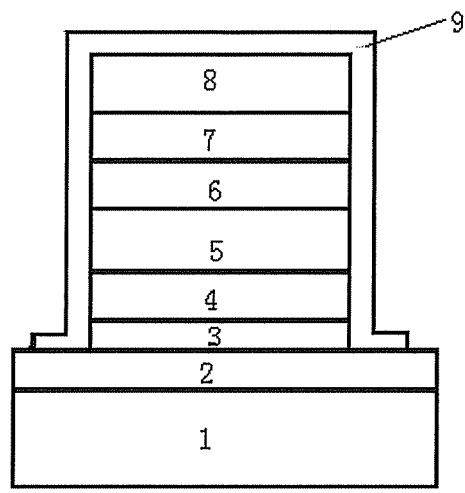
FIG. 1 is a structural diagram of an electroluminescent diode device in one preferred embodiment of the present disclosure.

The structure of an electroluminescent diode device of the present disclosure is shown in FIG. 1, from the bottom up comprising:

a transparent flexible substrate, which is at least one selected from the group consisting of poly(methyl methacrylate), poly(ethyleneadipate), and polycarbonate;

a first protective layer, which is a Barix layer consisting of alternating stacks of organic polymer materials and inorganic materials (since all the materials of the first protective layer shall enable the transmission of UV light, the organic polymer material may be selected from the group consisting of polymethylmethacrylate, poly(ethyleneglycol)adipate, and polycarbonate; and the inorganic material may have an optical band gap of no less than 3.96 eV, such as aluminium nitride, silicon nitride, and silicon oxide. Silicon nitride is a commonly used light-transmissive medium of UV devices);

an anode, being an ITO layer;

a hole transport layer, consisting of hole transport materials such as N,N'-diphenyl-N,N'-bis(3-methylphenyl)-1,1'-biphenyl-4,4'-diamine (TPD), N,N-diphenyl-N,N-(1-naphthyl)-1,1-biphenyl-4,4-diamine (NPD), etc.;

a UV light emitting layer;

a hole blocking layer, consisting of hole blocking materials such as 1,3,5-tri(1-phenyl-1H-benzimidazole-2-yl)benzene (TPBI), 2,9-dimethyl-4,7-biphenyl-1,10-phenanthroline (BCP), etc.;

an electron transport layer, consisting of electron transport materials, such as tri(8-hydroxyquinoline)aluminum (Alq3), etc.;

a cathode, consisting of cathode materials, such as Al, Ag, etc.; and a second protective layer, being an inorganic protective layer, and at least one selected from the group consisting of $TiO_2$, $MgO$, $SiO_2$, $ZrO_2$, $ZnO$, $Al_2O_3$, $LiF$, $MgF_2$, $ZnS$, $SiN_x$, $SiO_xN_y$, $SiO_xC_y$, and DLC films, wherein the second protective layer is disposed at an outer side of the cathode, and at the same time covers an outer surface of the device except the transparent flexible substrate, for cooperating with the first protective layer so as to isolate the device from the outside air and water vapor; and wherein the UV light emitting layer comprises a UV light emitting material which is at least one selected from the group consisting of fluorenes, triphenylamines, and quinquephenyls; and preferably, the UV light emitting material comprises a structure as shown in Formula I which contains carbazole, or a structure as shown in Formula II which contains quinquephenyl.

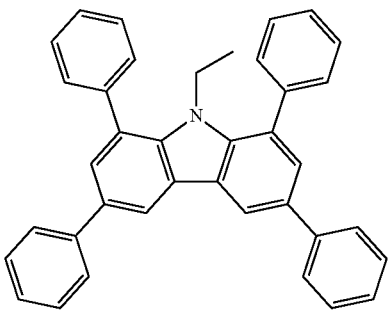

Formula I

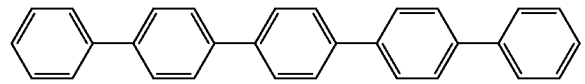

Formula II

The band gap of the UV light emitting material as shown in Formula I comprising carbazole is 3.25 Ev, and the peak value of emission spectra thereof is at 394 nm.

The band gap of the UV light emitting material as shown in Formula II comprising quinquephenyl is 3.48 eV, and the peak value of emission spectra thereof is at 310 nm.

Figure 2:
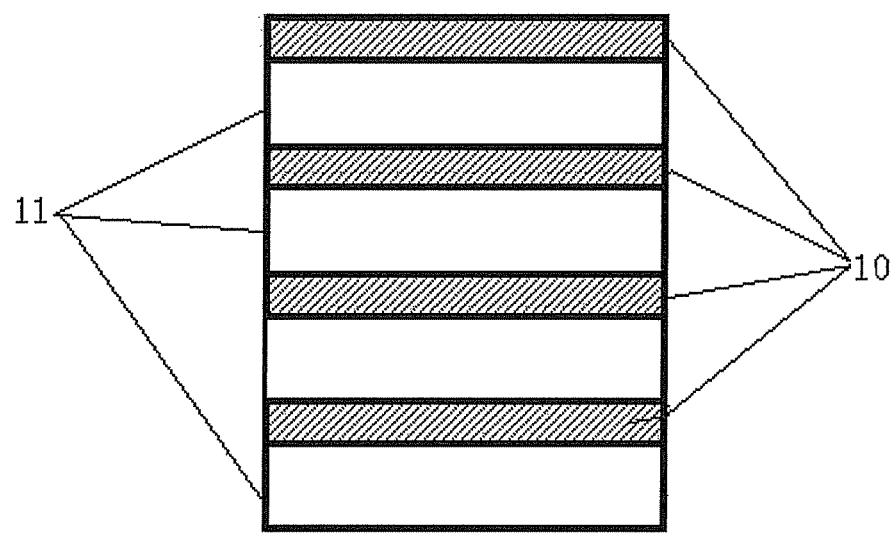
FIG. 2 is a structural diagram of a first protective layer in one preferred embodiment of the present disclosure.

The Barix protective layer is an alternating structure of polymer layers and inorganic dense layers, as shown in FIG. 2.

Example 2

Figure 3:
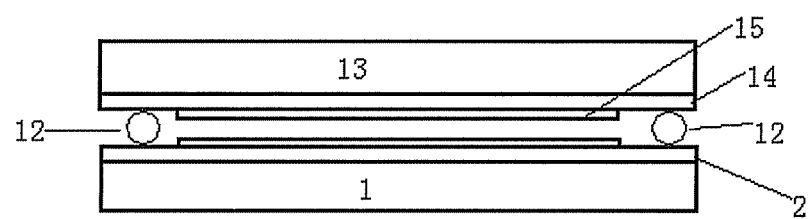
FIG. 3 is a structural diagram of an electroluminescent diode device in another preferred embodiment of the present disclosure.

As shown in FIG. 3, the structure of another electroluminescent diode of the present disclosure on the basis of that disclosed in Example 1 further comprises:

a packaging cover plate comprising a flexible cover plate, a third protective layer, and a desiccant layer arranged successively;

the structure of the third protective layer consists of organic polymer materials, or alternating stacks of organic polymer material layers and inorganic material layers;

the packaging cover plate and the electroluminescent diode are packaged in such a way that the desiccant layer of the packaging cover plate and an outer side of the second protective layer disposed to the electroluminescent diode are arranged opposite to each other with distance therebetween.

The third protective layer is a Barix layer, wherein the organic polymer material is at least one selected from the group consisting of poly-p-xylene, poly(monochloro-p-xylene), polyethylene, polystyrene, polypropylene, polyethylene naphthalate, polytetrafluoroethylene, soluble polytetrafluoroethylene, polyethylene terephthalate, polycarbonate, polymethyl methacrylate, polyvinyl acetate, polyether sulfone resin, and polyimide; and the inorganic material is selected from the group consisting of $TiO_2$, MgO, $SiO_2$, $ZrO_2$, ZnO, $Al_2O_3$, LiF, $MgF_2$, ZnS, $SiN_x$, $SiO_xN_y$, $SiO_xC_y$, and DLC films.

Figure 4:
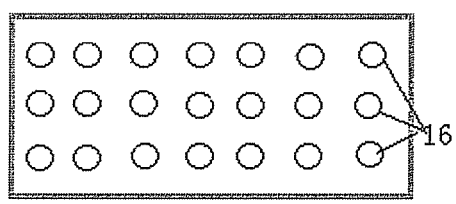
FIG. 4 is a diagram of a packaging adhesive in one preferred embodiment of the present disclosure.

The packaging is carried out by means of packaging adhesive, wherein the packaging adhesive is a UV light curing adhesive or a packaging adhesive formed by doping the UV light curing adhesive with glass powder. The purpose of doping the UV light curing adhesive with glass powder is to better prevent water vapor or oxygen from entering the inside of the package; meanwhile, glass powder is light transmissive so that it will not stop the UV light irradiation curing of the packaging adhesive. In this example, the packaging adhesive is as shown in FIG. 4. In the direction vertical to water vapor permeation, the whole cross section of the packaging adhesive allows permeation of water vapor or oxygen before the UV light curing adhesive is doped with glass powder. After the UV light curing adhesive is doped with glass powder, owing to a certain area covered by the glass powder, the infiltration area of water vapor and oxygen is reduced. Thus the infiltration capacity per unit time of water vapor or oxygen can be decreased, and better effect of packaging can be achieved. The diameter of glass powder should be in the range of 0.01~100 urn, and the doping proportion of UV light should be no more than 40%. The objective of doping the UV light curing adhesive with glass powder is to prevent water vapor or oxygen from entering the inside of the package. Meanwhile, glass powder allows the transmission of light and therefore will not stop the UV light irradiation curing of the packaging adhesive.

LIST OF REFERENCE NUMBERS 1 flexible substrate
2 first protective layer
3 anode
4 hole transport layer
5 UV light emitting layer
6 hole blocking layer
7 electron transport layer
8 cathode
9 second protective layer
10 inorganic layer
11 polymer material layer
12 packaging adhesive
13 flexible cover plate
14 third protective layer
15 desiccant layer
16 glass powder

The invention claimed is:

1. An electroluminescent diode device, comprising a transparent flexible substrate which is successively disposed with a first-protective layer, an anode, a hole transport layer, a UV light emitting layer, a hole blocking layer, an electron transport layer, and a cathode thereon,
wherein
the UV light emitting layer comprises a UV light emitting material which is at least one selected from the group consisting of fluorenes, triphenylamines, and quinquephenyls, and
the UV light emitting material comprises a structure as shown in Formula I which contains carbazole, or a structure as shown in Formula II which contains quinquephenyl,

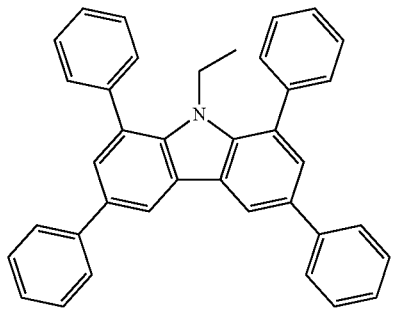

Formula I

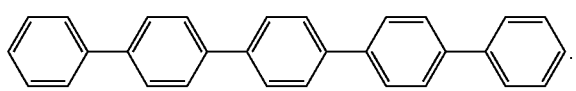

Formula II

2. The electroluminescent diode device of claim 1, wherein the transparent flexible substrate comprises a light transmissive material with weak absorption to UV light, the light transmissive material being at least one selected from the group consisting of polymethylmethacrylate, poly(ethyleneglycol)adipate, and polycarbonate.

3. The electroluminescent diode device of claim 1, wherein the transparent flexible substrate comprises a light transmissive material with weak absorption to UV light, the light transmissive material being at least one selected from the group consisting of polymethylmethacrylate, poly(ethyleneglycol)adipate, and polycarbonate.

4. The electroluminescent diode device of claim 1, wherein the first protective layer consists of organic polymer materials, or alternating stacks of organic polymer material layers and inorganic material layers.

5. The electroluminescent diode device of claim 1, wherein the first protective layer consists of organic polymer materials, or alternating stacks of organic polymer material layers and inorganic material layers.

6. The electroluminescent diode device of claim 4, wherein the organic polymer material layers comprise at least one selected from the group consisting of polymethylmethacrylate, poly(ethyleneglycol)adipate, and polycarbonate; and
the inorganic material layers comprise materials having an optical band gap of no less than 3.96 eV, preferably, at least one selected from the group consisting of aluminium nitride, silicon nitride, and silicon oxide.

7. The electroluminescent diode device of claim 5, wherein the organic polymer material layers comprise at least one selected from the group consisting of polymethylmethacrylate, poly(ethyleneglycol)adipate, and polycarbonate; and the inorganic material layers comprise materials having an optical band gap of no less than 3.96 eV, preferably, at least one selected from the group consisting of aluminium nitride, silicon nitride, and silicon oxide.

8. The electroluminescent diode device of claim 1, further comprising:

a second protective layer which is disposed at an outer side of the cathode and meanwhile covers an outer surface of the device except the transparent flexible substrate, for cooperating with the first protective layer so as to isolate the device from the outside air and water vapor; and a packaging cover plate comprising a flexible cover plate, a third protective layer, and a desiccant layer arranged successively;

wherein the third protective layer consists of organic polymer material layers, or alternating stacks of organic polymer material layers and inorganic material layers; and wherein the packaging cover plate and the electroluminescent diode are packaged in such a way that the desiccant layer of the packaging cover plate and an outer side of the second protective layer disposed to the electroluminescent diode are arranged opposite to each other with distance therebetween.

9. The electroluminescent diode device of claim 1, further comprising a second protective layer which is disposed at an outer side of the cathode and meanwhile covers an outer surface of the device except the transparent flexible substrate, for cooperating with the first protective layer so as to isolate the device from the outside air and water vapor.

10. The electroluminescent diode device of claim 8, wherein the second protective layer is an inorganic protective layer.

11. The electroluminescent diode device of claim 9, wherein the second protective layer is an inorganic protective layer.

12. The electroluminescent diode device of claim 10, wherein the material of the inorganic protective layer is at least one selected from the group consisting of $TiO_2$, MgO, $SiO_2$, $ZrO_2$, ZnO, $Al_2O_3$, LiF, $MgF_2$, ZnS, $SiN_x$, $SiO_xN_y$, $SiO_xC_y$, and diamond-like carbon (DLC) film.

13. The electroluminescent diode device of claim 11, wherein the material of the inorganic protective layer is at least one selected from the group consisting of $TiO_2$, MgO, $SiO_2$, $ZrO_2$, ZnO, $Al_2O_3$, LiF, $MgF_2$, ZnS, $SiN_x$, $SiO_xN_y$, $SiO_xC_y$, and diamond-like carbon (DLC) film.

14. The electroluminescent diode device of claim 1, further comprising:

a packaging cover plate comprising a flexible cover plate, a third protective layer, and a desiccant layer arranged successively;

wherein the third protective layer consists of organic polymer material layers, or alternating stacks of organic polymer material layers and inorganic material layers; and wherein the packaging cover plate and the electroluminescent diode are packaged in such a way that the desiccant layer of the packaging cover plate and an outer side of the second protective layer disposed to the electroluminescent diode are arranged opposite to each other with distance therebetween.

15. The electroluminescent diode device of claim 8, wherein the packaging is carried out by means of packaging adhesive, the packaging adhesive being a UV light curing adhesive or a packaging adhesive formed by doping the UV light curing adhesive with glass powder.

16. The electroluminescent diode device of claim 14, wherein the packaging is carried out by means of packaging adhesive, the packaging adhesive being a UV light curing adhesive or a packaging adhesive formed by doping the UV light curing adhesive with glass powder.

* * * * *